United States Patent
Briere

(10) Patent No.: US 9,312,374 B2
(45) Date of Patent: Apr. 12, 2016

(54) INTEGRATED POWER DEVICE WITH III-NITRIDE HALF BRIDGES

(71) Applicant: International Rectifier Corporation, El Segundo, CA (US)

(72) Inventor: Michael A. Briere, Scottsdale, AZ (US)

(73) Assignee: Infineon Technologies Americas Corp., El Segundo, CA (US)

( * ) Notice: Subject to any disclaimer, the term of this patent is extended or adjusted under 35 U.S.C. 154(b) by 75 days.

(21) Appl. No.: 14/222,332

(22) Filed: Mar. 21, 2014

(65) Prior Publication Data

US 2014/0203295 A1    Jul. 24, 2014

Related U.S. Application Data

(63) Continuation of application No. 12/234,829, filed on Sep. 22, 2008, now Pat. No. 8,680,579.

(60) Provisional application No. 60/973,989, filed on Sep. 20, 2007.

(51) Int. Cl.
*H01L 29/66* (2006.01)
*H01L 29/778* (2006.01)
*H01L 27/06* (2006.01)
*H01L 29/20* (2006.01)
*H01L 29/205* (2006.01)

(52) U.S. Cl.
CPC .......... *H01L 29/778* (2013.01); *H01L 27/0605* (2013.01); *H01L 29/2003* (2013.01); *H01L 29/205* (2013.01); *H01L 29/7787* (2013.01)

(58) Field of Classification Search
CPC ............ H01L 27/0605; H01L 29/2003; H01L 29/205; H01L 29/778; H01L 29/7787
USPC .................................. 257/192, 194, E29.246
See application file for complete search history.

(56) References Cited

U.S. PATENT DOCUMENTS 8,680,579 B2 * 3/2014 Briere ............................ 257/194
2007/0228424 A1 * 10/2007 Igarashi ........................ 257/256

* cited by examiner

*Primary Examiner* — Mark Tornow
(74) *Attorney, Agent, or Firm* — Farjami & Farjami LLP

(57) ABSTRACT

A semiconductor device that includes a plurality of isolated half-bridges formed in a common semiconductor die.

12 Claims, 7 Drawing Sheets

INTEGRATED POWER DEVICE WITH III-NITRIDE HALF BRIDGES

RELATED APPLICATION

This is a continuation of application Ser. No. 12/234,829 filed Sep. 22, 2008.

This application is based on and claims priority to U.S. Provisional Patent Application Ser. No. 60/973,989, filed on Sep. 20, 2007 and entitled "INDIVIDUALLY CONTROLLED MULTIPLE III-NITRIDE HALF BRIDGES," the entire contents of which is hereby incorporated by reference.

FIELD OF THE INVENTION

The present invention relates to semiconductor devices and more particularly to III-nitride based heterojunction power devices.

DEFINITION

III-nitride as referenced to herein includes semiconductor alloys from the InAlGaN system, including GaN, AlGaN, InGaN, MN, InAlGaN and the like.

DETAILED DESCRIPTION

Figure 1:
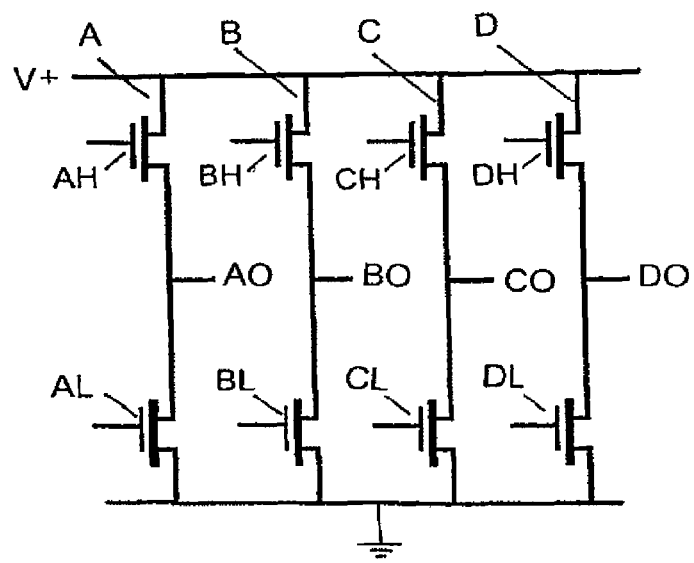
FIG. 1 schematically illustrates a multi-phase half-bridge arrangement according to the present invention.

FIG. 1 shows a circuit diagram of a plurality of half-bridge circuits A, B, C, D connected in parallel. Each half-bridge circuit includes a high side switch AH, BH, CH, DH, series connected with a low side switch AL, BL, CL, DL. Specifically, the source electrode of each high side switch is connected to the drain electrode of a corresponding low side switch. The point of connection of the two switches is commonly referred to as the switched node AO, BO, CO, DO of the half-bridge.

According to one aspect of the present invention, each switch in each half-bridge is a III-nitride heterojunction power switch, for example, a high electron mobility transistor.

According to another aspect of the present invention, all half-bridges are formed in a common semiconductor die, and are individually controllable, whereby the current output of the device can be adjusted by individual control of as many number of the half-bridges as desired.

Figure 3:
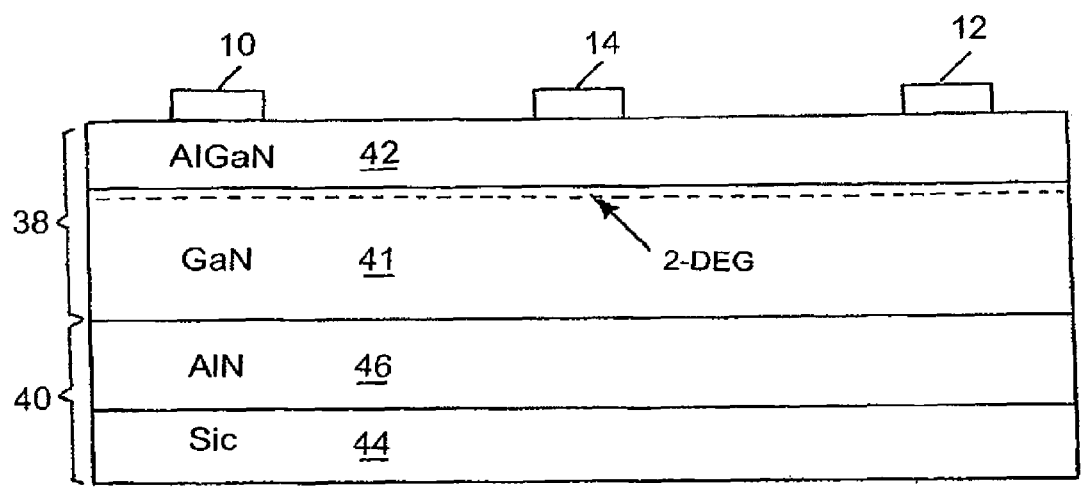
FIG. 3 illustrates a cross-sectional view along line 3-3 in FIG. 2 of a switch in any one of the half-bridges in a device according to the present invention viewed in the direction of the arrows.
Figure 2:
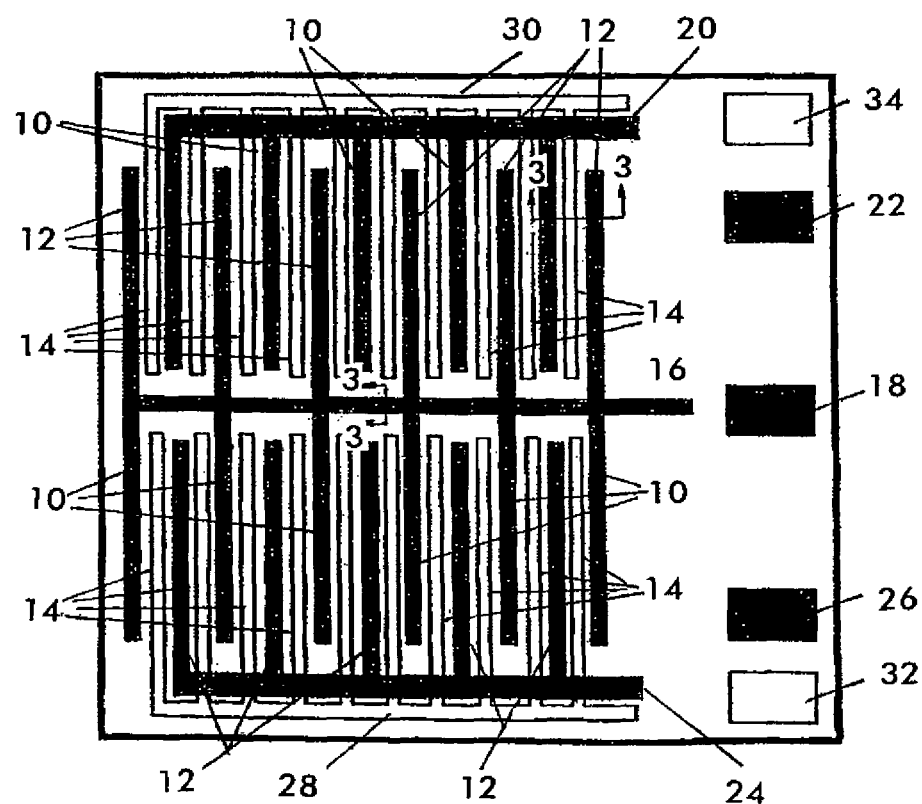
FIG. 2 illustrates a top plan view of a III-nitride device according to the present invention.
Figure 4:
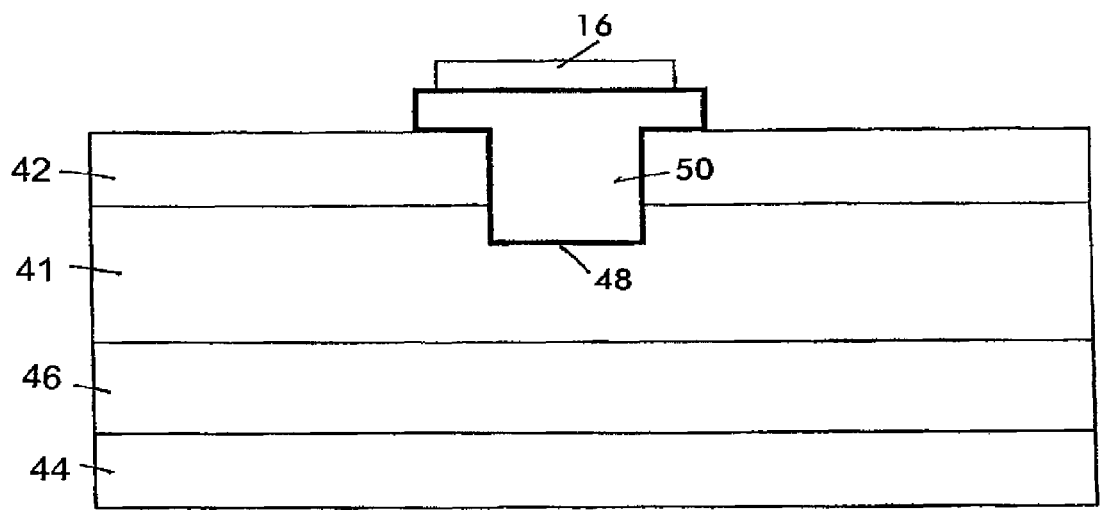
FIG. 4 illustrates a cross-sectional view of device according to the present invention along line 4-4 in FIG. 2 viewed in the direction of the arrows.

Referring to FIGS. 2, 3 and 4, a half-bridge according to the present invention includes two III-nitride switches formed in a common die. Each switch in each half-bridge includes a plurality of drain fingers 10, a plurality of source fingers 12, and a plurality of gate fingers 14, each disposed between a respective drain finger 10 and a respective source finger 12.

Note that, according to an aspect of the present invention, source fingers 12 of one device are connected to drain fingers 10 of the other device through a common conductive rail 16. Common conductive rail 16 may be then connected to a conductive pad 18 which will serve as the connection to the switched node of the half-bridge; i.e. the output of the half-bridge Note that drain fingers 10 of one switch are connected to a drain rail 20, which is then connected to a drain pad 22, serving as a connection to, for example, the high rail V+ of the half-bridge. Further, source fingers 12 of the other switch are connected to the source rail 24, which is then connected to a conductive source pad 26, serving as a connection to the ground voltage of the half-bridge. In addition, each gate finger 14 in each device is connected to a respective gate rail 28, 30. Each gate rail 28, 30 is connected to a respective gate pad 32, 34, which is for receiving a respective gate signal for the operation of the switch.

Note that FIG. 2 is a basic half-bridge block which can be used both in the drive stage and the power stage of a device according to the present invention as set forth below.

Referring now to FIG. 3, each switch in the half-bridge includes an active heterojunction 38 formed over a support body 40. Active heterojunction 38 includes a first III-nitride body 41 (e.g., GaN), and a second III-nitride body 42 (e.g., AlGaN) having a band gap different from the band gap of first III-nitride body 41 formed on first III-nitride body 41, having a thickness and composition to generate a two dimensional electron gas (2-DEG) at its junction with body 41.

Support body 40 may include a silicon substrate 44 (or any other suitable substrate, such as SiC or Sapphire), and, if necessary, a transition layer 46 (e.g., MN).

Referring now to FIG. 4, to electrically isolate the two switches, a trench 48 extending through body 42 may be provided under, for example, rail 16. Trench 48 splits body 42, and thus interrupts the 2-DEG, rendering the devices electrically isolated. Note that trench 48 may be filled with an insulation body 50, over which rail 16 may lie, as illustrated.

Figure 6:
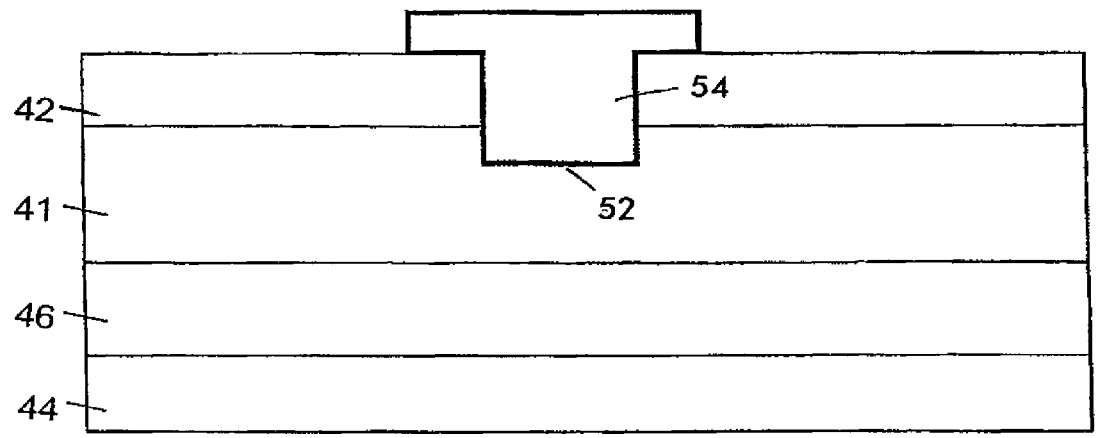
FIG. 6 illustrates a cross-sectional view of device according to the present invention along line 5-5 in FIG. 5 viewed in the direction of the arrows.
Figure 5:
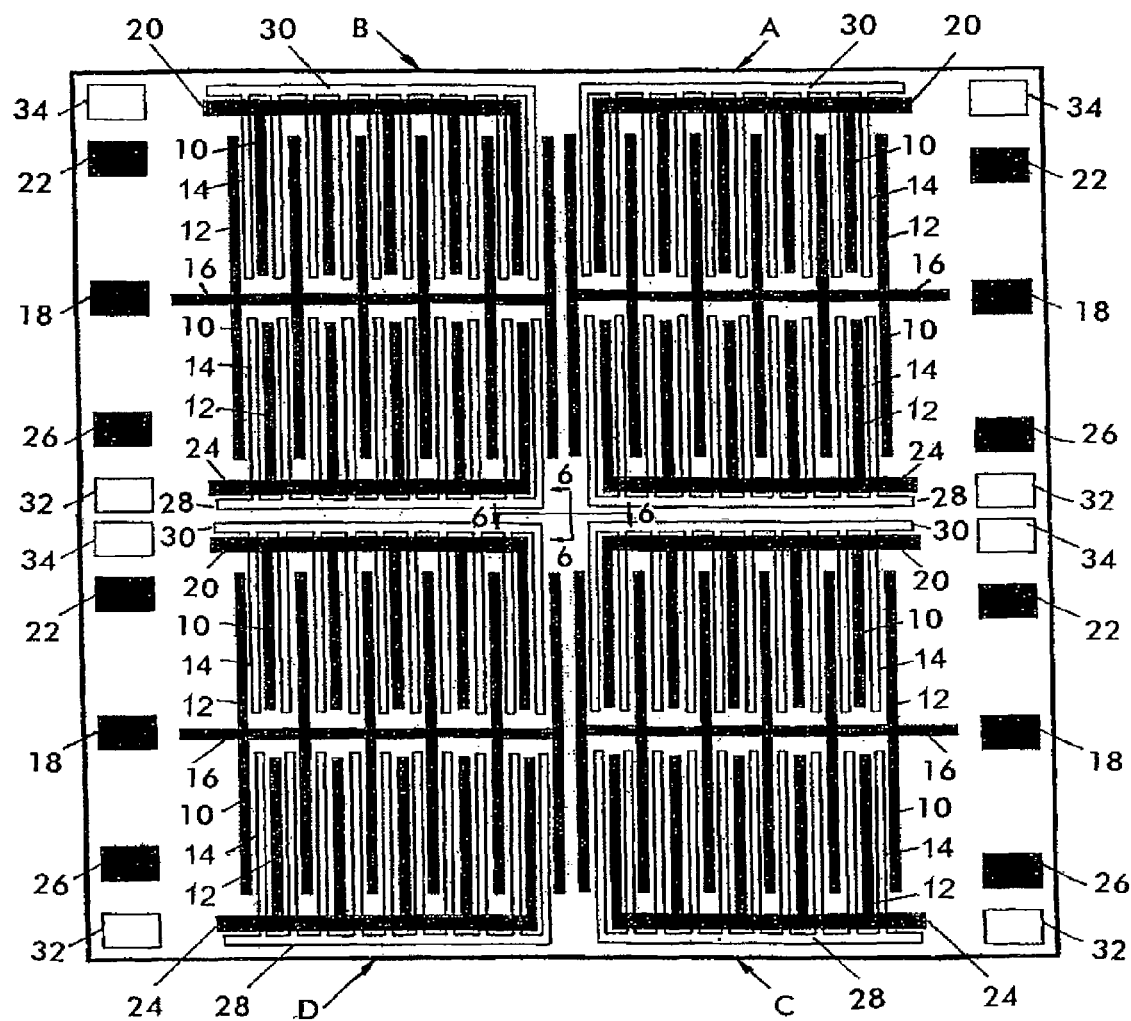
FIG. 5 illustrates a top plan view of a semiconductor device including a plurality of half-bridges according to the present invention.

Referring now to FIGS. 5 and 6, according to another aspect of the present invention, a plurality of half-bridges according to the present invention can be formed in a single die. Each half-bridge may be fabricated according to the basic half-bridge block of FIG. 2. Referring specifically to FIG. 6, each half-bridge may be electrically isolated from the other half-bridges by an isolation trench 52, which extends through at least body 42 in order to obtain electrical isolation as described above. Trench 52 may be filled with an insulator 54.

Figure 7:
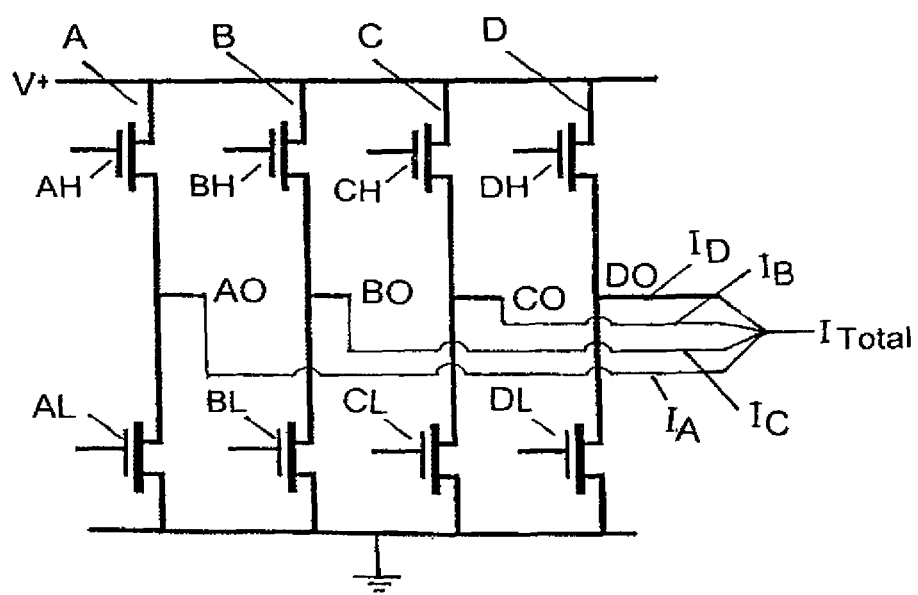
FIG. 7 schematically illustrates the power deliver configuration of a device according to the present invention.

Referring now to FIG. 7, according to one aspect of the present invention, each half-bridge can be controlled individually and the output of each can be combined to obtain a desired total output. Thus, the output from each pad 18 can be fed into a common pad on, or outside the die to obtain a total output. Schematically, the output current $I_A$, $I_B$, $I_C$, $I_D$ of the half-bridges A, B, C, D can be combined to obtain a total current $I_{total}$.

Figure 8:
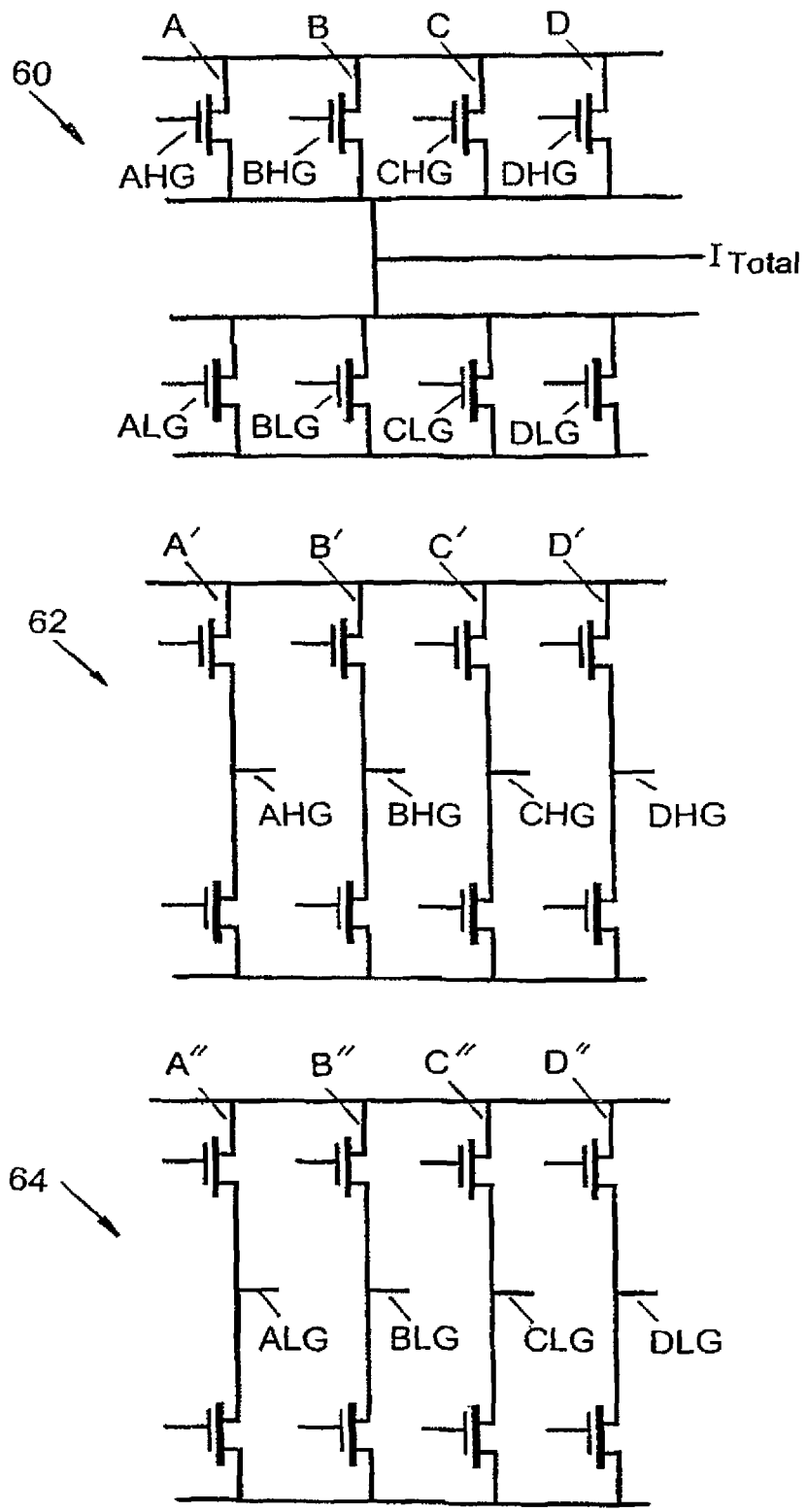
FIG. 8 schematically illustrates a power management arrangement which includes devices according to the present invention.

Referring to FIG. 8, according to another aspect of the present invention, a device according to the present invention as, for example, set forth in FIG. 5, can be used in the power stage 60 of a power circuit as well as in the driver stages 62, 64. Thus, each switch in each half-bridge A, B, C, D in power stage 60 can be driven by a corresponding bridge A', B', C', D' in the high side driver 62, or a corresponding bridge A", B", C", D" in low side driver 64.

Figure 9:
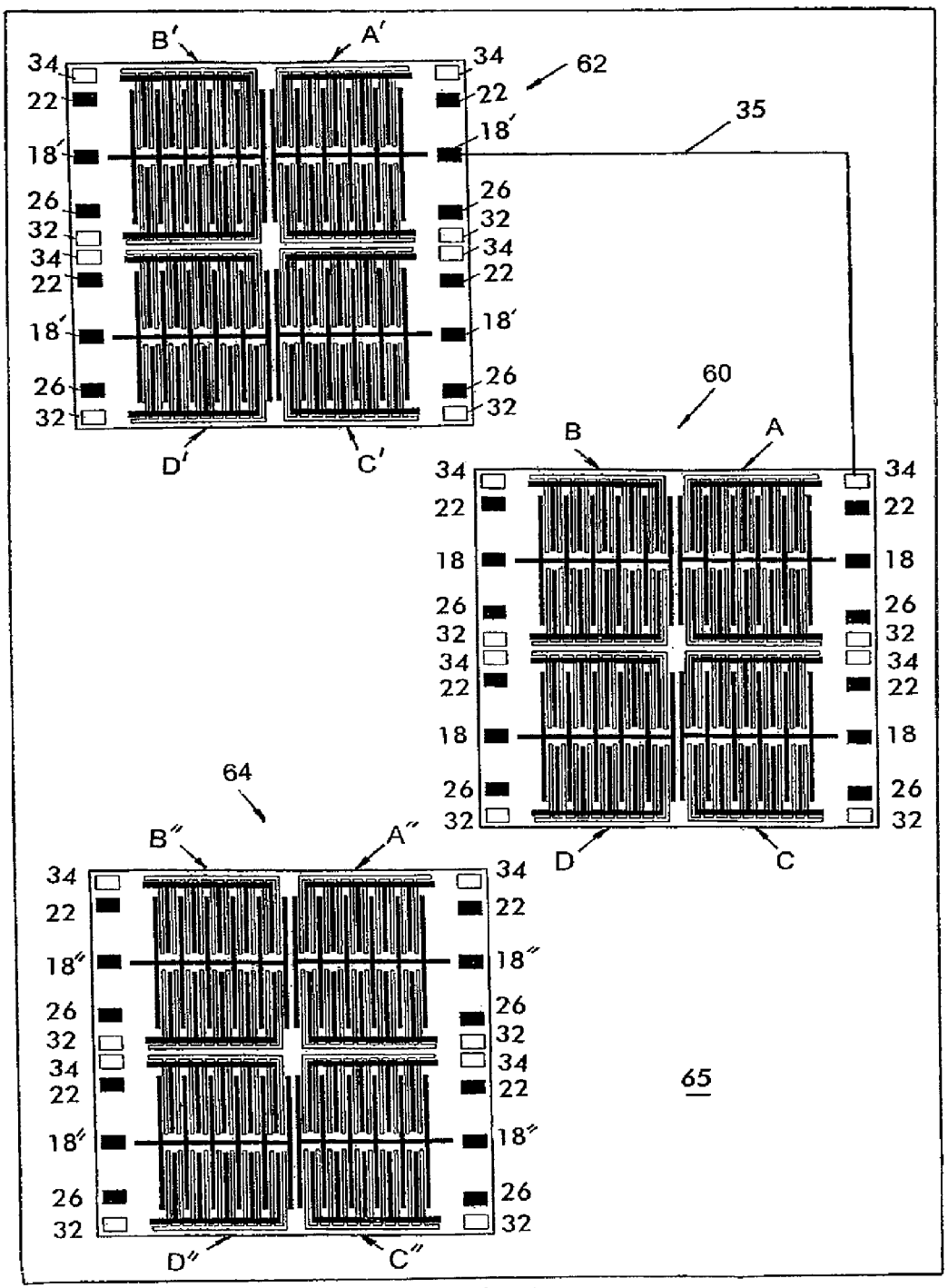
FIG. 9 schematically illustrates an integrated device according to an embodiment of the present invention.

Referring to FIG. 9, in one embodiment of the present invention, a power stage 60 and driver stages 62, 64 are formed in a single common semiconductor die 65. Power stage 60 can include multiple half-bridges and fabricated to include the features set forth in FIG. 5. Similarly, driver stages 62, 64 can include multiple half-bridges and fabricated to include the features set forth in FIG. 5. Note that power stage 62 and driver stages 62, 64 can be isolated using, for example, an isolating trench which may be filled with an insulator as set forth above and illustrated by FIG. 6.

As illustrated by FIG. 9, the output of each half-bridge in a driver stage 62, 64 is connected to the gates of a respective high side or low side switch in half-bridges of power stage 60. Thus, for example, the output 18' of half-bridge A' of driver stage 62 is connected to the gates of high side switch AHG of half-bridge A in power stage 60 through, for example, gate contact 34.

The connection may be made using a bus 35 as illustrated. The remaining half-bridges in driver stages 62, 64 may be connected to respective gates of switches in half-bridges of power stage 60 in a similar manner.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A single semiconductor die having formed therein an integrated power device comprising:
   a power stage including a plurality of parallel-connected half-bridges each including a high side III-nitride power semiconductor device and a low side III-nitride power semiconductor device;
   said high side III-nitride power semiconductor device and said low side III-nitride power semiconductor device, each including source fingers, drain fingers, and gate fingers;
   said source fingers of said high side III-nitride power semiconductor device and said drain fingers of said low side III-nitride power semiconductor device being coupled to one another;
   wherein said integrated power device includes an isolation trench in said single semiconductor die to electrically isolate said high side and low side III-nitride power semiconductor devices.

2. The single semiconductor die of claim 1, wherein said high side III-nitride power semiconductor device comprises a III-nitride heterojunction that includes one III-nitride semiconductor body having one band gap formed over another III-nitride semiconductor body having another band gap to generate a two-dimensional electron gas.

3. The single semiconductor die of claim 1, wherein said low side III-nitride power semiconductor device comprises a III-nitride heterojunction that includes one III-nitride semiconductor body having one band gap formed over another III-nitride semiconductor body having another band gap to generate a two-dimensional electron gas.

4. The single semiconductor die of claim 2, wherein said one III-nitride body comprises AlGaN and said another III-nitride body comprises GaN.

5. The single semiconductor die of claim 3, wherein said one III-nitride body comprises AlGaN and said another III-nitride body comprises GaN.

6. The single semiconductor die of claim 1, wherein said source fingers and said drain fingers are alternately arranged in an interdigitated pattern.

7. A single semiconductor die having formed therein an integrated power device comprising:
   a first III-nitride power semiconductor device and a second III-nitride power semiconductor device, each including source fingers, drain fingers, and gate fingers;
   said source fingers of said first III-nitride power semiconductor device and said drain fingers of said second III-nitride power semiconductor device being coupled to one another;
   a first output of a first half-bridge coupled to a first gate of said first III-nitride power semiconductor device;
   a second output of a second half-bridge coupled to a second gate of said second III-nitride power semiconductor device;
   wherein said integrated power device includes an isolation trench in said single semiconductor die to electrically isolate said first and second III-nitride power semiconductor devices.

8. The single semiconductor die of claim 7, wherein said first III-nitride power semiconductor device comprises a III-nitride heterojunction that includes one III-nitride semiconductor body having one band gap formed over another III-nitride semiconductor body having another band gap to generate a two-dimensional electron gas.

9. The single semiconductor die of claim 7, wherein said second III-nitride power semiconductor device comprises a III-nitride heterojunction that includes one III-nitride semiconductor body having one band gap formed over another III-nitride semiconductor body having another band gap to generate a two-dimensional electron gas.

10. The single semiconductor die of claim 8, wherein said one III-nitride body comprises AlGaN and said another III-nitride body comprises GaN.

11. The single semiconductor die of claim 9, wherein said one III-nitride body comprises AlGaN and said another III-nitride body comprises GaN.

12. The single semiconductor die of claim 7, wherein said source fingers and said drain fingers are alternately arranged in an interdigitated pattern.

* * * * *